(12) United States Patent
Zhang et al.

(10) Patent No.: US 6,924,212 B2
(45) Date of Patent: *Aug. 2, 2005

(54) METHOD FOR FORMING A SEMICONDUCTOR

(75) Inventors: Honyong Zhang, Kanagawa (JP); Naoto Kusumoto, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/453,689

(22) Filed: Jun. 4, 2003

(65) Prior Publication Data

US 2003/0207524 A1 Nov. 6, 2003

Related U.S. Application Data

(62) Division of application No. 09/021,151, filed on Feb. 10, 1998, now Pat. No. 6,576,534, which is a division of application No. 08/453,558, filed on May 26, 1995, now Pat. No. 5,766,344, which is a continuation of application No. 08/266,792, filed on Jun. 28, 1994, now abandoned, which is a continuation of application No. 07/947,519, filed on Sep. 21, 1992, now abandoned.

(30) Foreign Application Priority Data

Sep. 21, 1991 (JP) .............................. 3-270359

(51) Int. Cl.$^7$ .............................................. H01L 21/20
(52) U.S. Cl. ...................................... 438/485; 438/487
(58) Field of Search ................................ 438/485–488

(56) References Cited

U.S. PATENT DOCUMENTS

| | | |
|---|---|---|
| 4,151,058 A | 4/1979 | Kaplan et al. |
| 4,226,898 A | 10/1980 | Ovshinsky et al. |
| 4,266,986 A | 5/1981 | Benton et al. |
| 4,309,225 A | 1/1982 | Fan et al. |
| 4,313,783 A | 2/1982 | Davies et al. |

(Continued)

FOREIGN PATENT DOCUMENTS

| | | |
|---|---|---|
| EP | 0211634 | 2/1987 |
| JP | 57-180116 | 11/1982 |
| JP | 60-42817 | 3/1985 |
| JP | 60-105216 | 6/1985 |
| JP | 60-227484 | 11/1985 |

(Continued)

OTHER PUBLICATIONS

"High Mobility Poly–Si Thin Film Transistors Using Solid Phase Crystallized A–Si Films Deposited by Plasma–Enhanced Chemical Vapor Deposition" Satoshi Takenaka et al., Japanese Journal of Applied Physics, vol. 29, No. 11, Dec. 1990.

(Continued)

Primary Examiner—David Nelms
Assistant Examiner—David Vu
(74) Attorney, Agent, or Firm—Eric J. Robinson; Robinson Intellectual Property Law Office, P.C.

(57) ABSTRACT

A preparing method of a semiconductor, particularly a preparing method of a polycrystal semiconductor film which has a good electrical property is disclosed. In order to obtain a non-crystalline silicon film containing a lot of combination of hydrogen and silicon, a forming process of a non-crystalline silicon film by a low temperature gas phase chemical reaction, a process of a heat annealing to produce a lot of dangling bonds of silicon, so as to draw out hydrogen from said non-crystalline silicon film, and a process of applying a laser irradiation to said non-crystal silicon film having a lot of dangling bond of silicon are conducted.

24 Claims, 5 Drawing Sheets

U.S. PATENT DOCUMENTS

| | | |
|---|---|---|
| 4,321,420 A | 3/1982 | Kaplan et al. |
| 4,322,253 A | 3/1982 | Pankove et al. |
| 4,370,175 A | 1/1983 | Levatter |
| 4,379,727 A | 4/1983 | Hansen et al. |
| 4,388,145 A | 6/1983 | Hawkins et al. |
| 4,402,762 A | 9/1983 | John et al. |
| 4,405,435 A | 9/1983 | Tateishi et al. |
| 4,406,709 A | 9/1983 | Celler et al. |
| 4,436,557 A | 3/1984 | Wood et al. |
| 4,475,027 A | 10/1984 | Pressley |
| 4,482,395 A | 11/1984 | Hiramoto |
| 4,498,416 A | 2/1985 | Bouchaib |
| 4,503,807 A | 3/1985 | Nakayama et al. |
| 4,523,370 A | 6/1985 | Sullivan et al. |
| 4,552,595 A | 11/1985 | Hoga |
| 4,555,301 A | 11/1985 | Gibson et al. |
| 4,557,036 A | 12/1985 | Kyuragi et al. |
| 4,567,061 A | 1/1986 | Hayashi et al. |
| 4,569,697 A | 2/1986 | Tsu et al. |
| 4,571,348 A | 2/1986 | Troxell |
| 4,576,851 A | 3/1986 | Iwamatsu |
| 4,582,720 A | 4/1986 | Yamazaki |
| 4,589,951 A | 5/1986 | Kawamura |
| 4,590,091 A | 5/1986 | Rogers, Jr. et al. |
| 4,592,306 A | 6/1986 | Gallego |
| 4,592,799 A | 6/1986 | Hayafuji |
| 4,595,601 A | 6/1986 | Horioka et al. |
| 4,609,407 A | 9/1986 | Masao et al. |
| 4,638,110 A | 1/1987 | Erbert |
| 4,640,223 A | 2/1987 | Dozier |
| 4,663,829 A | 5/1987 | Hartman et al. |
| 4,694,143 A | 9/1987 | Nishimura et al. |
| 4,698,486 A | 10/1987 | Sheets |
| 4,699,863 A | 10/1987 | Sawatari et al. |
| 4,719,123 A | 1/1988 | Haku et al. |
| 4,800,174 A | 1/1989 | Ishihara et al. |
| 4,808,554 A | 2/1989 | Yamazaki |
| 4,843,022 A | 6/1989 | Yamazaki |
| 4,888,305 A | 12/1989 | Yamazaki et al. |
| 4,937,205 A | 6/1990 | Nakayama et al. |
| 4,951,601 A | 8/1990 | Maydan et al. |
| 4,988,642 A | 1/1991 | Yamazaki |
| 5,091,334 A | 2/1992 | Yamazaki et al. |
| 5,132,754 A * | 7/1992 | Serikawa et al. ............. 257/57 |
| 5,145,808 A | 9/1992 | Sameshima et al. |
| 5,149,675 A | 9/1992 | Wills et al. |
| 5,171,710 A | 12/1992 | Yamazaki et al. |
| 5,174,881 A | 12/1992 | Iwasaki et al. |
| 5,186,718 A | 2/1993 | Tepman et al. |
| 5,194,398 A | 3/1993 | Miyachi et al. |
| 5,198,371 A | 3/1993 | Li |
| 5,200,017 A | 4/1993 | Kawasaki et al. |
| 5,219,786 A | 6/1993 | Noguchi |
| 5,234,528 A | 8/1993 | Nishi |
| 5,266,116 A | 11/1993 | Fujioka et al. |
| 5,288,658 A | 2/1994 | Ishihara |
| 5,292,675 A | 3/1994 | Codama |
| 5,296,405 A | 3/1994 | Yamazaki et al. |
| 5,304,357 A | 4/1994 | Sato et al. |
| 5,306,651 A | 4/1994 | Masumo et al. |
| 5,310,410 A | 5/1994 | Begin et al. |
| 5,314,538 A | 5/1994 | Maeda et al. |
| 5,314,839 A | 5/1994 | Mizutani et al. |
| 5,318,919 A * | 6/1994 | Noguchi et al. ............ 438/166 |
| 5,324,360 A | 6/1994 | Kozuka |
| 5,352,291 A | 10/1994 | Zhang et al. |
| 5,372,836 A | 12/1994 | Imahashi et al. |
| 5,578,520 A | 11/1996 | Zhang et al. |
| 5,708,252 A | 1/1998 | Shinohara et al. |
| 5,861,337 A | 1/1999 | Zhang et al. |
| 6,174,374 B1 | 1/2001 | Zhang et al. |
| 6,576,534 B1 * | 6/2003 | Zhang et al. ............... 438/486 |

FOREIGN PATENT DOCUMENTS

| | | |
|---|---|---|
| JP | 62-104117 | 5/1987 |
| JP | 63-160336 | 7/1988 |
| JP | 63-224318 | 9/1988 |
| JP | 64-72522 | 3/1989 |
| JP | 1-179410 | 7/1989 |
| JP | 1-251734 | 10/1989 |
| JP | 2-12812 | 1/1990 |
| JP | 2-73623 | 3/1990 |
| JP | 02-81424 | 3/1990 |
| JP | 2-081424 | 3/1990 |
| JP | 2-103924 | 4/1990 |
| JP | 02-103924 | 4/1990 |
| JP | 2-239615 | 9/1990 |
| JP | 02-239615 | 9/1990 |
| JP | 2-257619 | 10/1990 |
| JP | 2-295111 | 12/1990 |
| JP | 03-19370 | 1/1991 |
| JP | 3-22540 | 1/1991 |
| JP | 03-22540 | 1/1991 |
| JP | 3-24717 | 2/1991 |
| JP | 03-24717 | 2/1991 |
| JP | 3-201430 | 9/1991 |
| JP | 3-286518 | 12/1991 |
| JP | 4-179267 | 6/1992 |
| JP | 63-224318 | 9/1998 |

OTHER PUBLICATIONS

"Vapor Phase Growth," G.B. Stringfellow; *Crystal Growth*, vol. 16, $2^{nd}$ Ed., Pamplin, Chapter 5, pps 181–202.

Kuwano et al., (1981), $15^{th}$ IEEE Photovoltaic Spec. Conf., pp. 698–703.

Oct. 1989, *Nikkei Microdevices* (magazine) pp. 34–39.

Sameshima et al., (1989) *Jpn. J. Appl. Phys.*, vol. 28, No. 10, (pp. 1789–1793).

Sera et al., (1989) *IEEE Trans. On Elect. Devices*, vol. 36, No. 12 (pp. 2868–2872).

Jhon et al., (1994) *Jpn. J. Appl. Phys.*, vol. 33, pp. L 1438–L 1441.

Wagner et al., (1989) *Appl. Surf. Science*, 43, pp. 260–263.

Takenaka et al., (1990) *Jpn. J. Appl. Phys.*, vol. 29, No. 12, pp. L 2380–2383.

* cited by examiner

METHOD FOR FORMING A SEMICONDUCTOR

This application is a DIV of Ser. No. 09/021,151 Feb. 10, 1998 U.S. Pat. No. 6,576,534 which is a DIV of Ser. No. 08/453,558 May 26, 1995 U.S. Pat. No. 5,766,344 which is a CON of Ser. No. 08/266,792 Jun. 28, 1994 ABN which is a CON of Ser. No. 07/947,519 Sep. 21, 1992 ABN.

BACKGROUND OF THE INVENTION

1. Field of the Invention

The present invention relates to a method for forming a semiconductor. Particularly, the present invention relates to a method for forming a semiconductor film, which has an excellent crystalline property and contains less impurity in a crystalline film. The semiconductor film prepared in accordance with the method of the present invention can be used in such semiconductor device as a high quality thin film transistor having a high field effect mobility.

2. Description of the Related Art

So far, a method for crystallization of a non-crystalline silicon hydride film formed by a plasma CVD or a heat CVD method, which contains a lot of hydrogen, and a lot of bonding hands of silicon which are neutralized with hydrogen (it can be described as a-Si:H), by irradiating such laser light as CW (Continuous-wave) laser and Excimer laser has been well known.

This method, however, poses a problem that a non-crystalline silicon film as a starting film contains a lot of hydrogen, much of which spouts from the film when the film is subjected to a laser irradiation, and then a film quality deteriorates remarkably. To overcome this problem, there have been used chiefly the following three methods.

(A) At first, by irradiating a low energy density (less than threshold value energy for crystallization) laser light to a non-crystalline silicon hydride film as a sample, hydrogen in the starting film as a sample will be drawn out. And then, by irradiating a high energy density laser light to the sample, the sample will be crystallized. This is called as a multi-stage irradiation method.

(B) By forming a non-crystalline silicon hydride film, at 400° C. or more of a substrate temperature, a hydrogen content in the starting film will be decreased. Thus, a film quality deterioration by a laser irradiation will be prevented.

(C) By effecting a heat treatment of a non-crystalline silicon hydride film, in an inactive atmosphere, hydrogen in the film will be removed.

The following problems, however, have been posed, in order to obtain a high quality crystal film (in general, polycrystal silicon film) by the above mentioned methods.

(1) The method of (A) has a problem in a practical use. Namely, it is bad in an efficiency of hydrogen drawing out, difficult to control a laser energy output, and required to increase the number of laser irradiation times. Since almost all the laser light energy is absorbed in the film surface, it is difficult to draw out hydrogen, in case of a thick film.

(2) The method of (B) has a problem that a crystallization is obstructed in a later process of crystallization by a laser light. This is caused by that an impurity content in the film is inclined to increase, when a substrate temperature becomes high, and a silicon cluster (microcrystal part of silicon) is formed, if a non-crystalline silicon hydride film is formed at a high temperature.

(3) The method of (c) has a problem that an electric property (carrier mobility etc.) of the crystal film deteriorates, caused by such impurity as oxygen. This is derived from the reason that since hydrogen is eliminated by heating, a dangling bond (unpaired bonding hand) of silicon is formed, and the dangling bond combines easily with oxygen etc. then, the oxygen intrudes easily into the film from its surface to 10 to 20 nm in depth, and diffuses into the film deeply by a high temperature diffusion.

SUMMARY OF THE INVENTION

Accordingly, it is an object of the present invention to solve the above mentioned problems. The object can be accomplished by adopting a method for forming a semiconductor in accordance with the present invention. Such a method in accordance with the present invention is described below (a) to (c).

(a) A non-crystalline (amorphous or microcrystal) silicon hydride film having a Si-H bond of high density is formed on a substrate, at a low temperature by a gas phase chemical reaction (chemical vapor deposition). As a method of the gas phase chemical reaction, such conventional method as a plasma CVD (chemical vapor deposition) method, a heat CVD (thermal chemical vapor deposition) method, and a light CVD (photo chemical vapor deposition) method can be employed. At this time, it is needed to form a non-crystalline (amorphous or microcrystal) silicon hydride film at 350° C. or lower of a substrate temperature, which is said to be an eliminating temperature of hydrogen from the non-crystalline (amorphous or microcrystal) silicon hydride. This is to increase the number of bond between silicon and hydrogen (Si—H bonding), by making hydrogen contain in a film as much as possible, in a film forming process. It is preferable to form a film at a substrate temperature as low as possible, in order to maximize Si—H bonding. However, in an actual use, it is possible to achieve the maximizing object of Si—H bonding, by forming a film at 100 to 200° C. of the substrate temperature.

Also, it is possible to prevent a silicon cluster (microcrystal of silicon) from being formed in a film, by effecting a film forming at a low temperature, and to expect a more uniform crystallization, at a later crystallizing process.

(b) Hydrogen in a non-crystalline (amorphous or microcrystal) silicon film is expelled from the silicon film and a high density dangling bond is formed in silicon, by effecting a heat treatment (thermal annealing) of the non-crystalline (amorphous or microcrystal) silicon film, which was formed in the above mentioned (a) process, in a vacuum or inactive gas atmosphere. The heat treatment in a vacuum or inactive gas atmosphere comes from that a combination (bonding) of the dangling bond of silicon and such impurity as oxygen is prevented to the utmost. It is important for the heating temperature that the substrate temperature be 350° C. or higher and also 500° C. or lower. This is based on that the eliminating temperature of hydrogen from a non-crystalline (amorphous or microcrystal) silicon hydride is about 350° C., and the crystallization starting temperature of a non-crystalline (amorphous or microcrystal) silicon is about 500° C. Also, since there is a case where the crystallization starts at 450° C., when an impurity concentration, especially oxygen in the film is low, it is preferable that this heating process to draw out hydrogen is carried out at 400° C. extent in an actual use. It is suitable that the time for the heating process is in the degree of 30 min. to 6 hrs. The inactive gas atmosphere comprises a material selected from the group consisting of $N_2$, Ar, $H_2$, He and a mixture thereof. In case of the inactive gas atmosphere, the heated amorphous or microcrystal film is irradiated with the laser light through a cap layer provided on the heated amorphous or microcrystal film. Pressure of the inactive gas atmosphere is e.g. 0.5 atm. to 1.5 atm.

This heating process is to be carried out, so as to produce a lot of dangling bond, by releasing hydrogen made be contained in a non-crystalline (amorphous or microcrystal) silicon in the above (a) process. Moreover, this producing a lot of dangling bond is to make the crystallization easy, in a later crystallizing process by a laser irradiation or heating. So that it is not preferable that the non-crystalline (amorphous or microcrystal) silicon film crystallizes in this heat treatment step. The reason why the crystallization (including a cluster state in the very small region) in this heat treatment step should be avoided is based on the fact that once crystallized film will not give a good quality in an electric performance, on the contrary, it will deteriorate, even if an energy for the crystallization (e.g. irradiation energy of laser) is added.

Also, afterward, there is a crystallizing process for non-crystalline (amorphous or microcrystal) silicon film by a laser irradiation or a heating. But, it is very effective in the improvement of film crystalline property in a crystallizing process by the later laser irradiation or the heating, to maintain an atmosphere in a vacuum or inactive state and to avoid a combination (bonding) of impurity with the dangling bond of film to the utmost, up to this crystallizing process.

(c) A non-crystalline (amorphous or microcrystal) silicon film is crystallized by a laser irradiation or a heating with the vacuum or inactive gas atmosphere maintained. In this process, it is extremely important not to break the vacuum state or inactive gas atmosphere in succession with the above (b) process. This results from the reason that silicon in the non-crystalline silicon film is apt to react with impurity exceedingly, as a dangling bond has been formed with high density in the non-crystalline (amorphous or microcrystal) silicon film during the heating (thermal annealing) process (b). The non-crystalline (amorphous or microcrystal)silicon film is maintained in a vacuum or inactive gas atmosphere from the process (b) to the process (c). The non-crystalline (amorphous or microcrystal) silicon film is irradiated with a laser light or heated at a temperature of 500° C. or higher in the process (c). The process (c) is carried out after the process (b).

Also, it is effective in the improvement of crystalline property to apply a laser irradiation to a substrate, heating it at about 300° C. to 500° C., so as to lower a cooling speed of the substrate temperature, at this occasion. In case of the crystallizing by only heating, it can be effected by heating at a temperature of 450° C. or higher, typically 450° C. to 800° C., but in general, it is conducted by heating at 600° C. degree for 1 hr. to 96 hrs. considering a heat-resistant temperature of a glass substrate.

In the claim of the present invention, it is defined that a non-crystalline (amorphous or microcrystal) silicon starts on crystallization at 500° C. or higher. But, it starts on it at the degree of 450° C., if an oxygen concentration in a film is very low. Therefore, it is defined as such.

In the present invention, it is important to form a non-crystalline (amorphous or microcrystal) silicon hydride film which has high density bonds between silicon and hydrogen, as a starting film, and to obtain a non-crystalline (amorphous or microcrystal) silicon having a high density dangling bond, drawing out hydrogen from the starting film, through the heat annealing process to accelerate a dehydrogenation from the film. The employment of such film is due to the fact that the film has a tendency to crystallize, as a non-crystalline silicon film having a high density dangling bond of silicon is active in a lattice vibration of an atom level, and is in a very unstable condition thermally. And then, a polycrystal silicon semiconductor film is obtained by crystallizing the non-crystalline (amorphous or microcrystal) silicon film, which has been apt to crystallize, after the dangling bond was formed with high density, by a laser irradiation and a heating for the crystallization.

Also, it is important to maintain the non-crystalline (amorphous or microcrystal) silicon semiconductor film in an atmosphere isolated from the open air, in the above mentioned process, i.e. from the film forming (film deposition) process (a) to the crystallization process (c) through the heating process (b). This is to prevent the dangling bond from combining with oxygen etc. to the utmost. And in order to attain this object, an equipment having a chamber, which is provided with a high vacuum exhaust system, a quartz window for laser irradiation, a heating apparatus for heating process and the like, is needed. In an industrial scale, a multi-chamber type equipment provided with the above mentioned apparatus or device is useful.

BRIEF DESCRIPTION OF THE DRAWING

The objects, features, and advantages of the present invention will become more apparent, from the following description of the preferred embodiment taken in conjunction with the accompanying drawings, in which.

DETAILED DESCRIPTION OF THE PREFERRED EMBODIMENT

The present invention will be explained in more detail by reference to the following Examples, in connection with the drawings. The present invention is by no means limited to the Examples.

EXAMPLE 1

Here is shown an n-channel type thin film insulated gate field effect transistor, which uses the polycrystal silicon (poly-Si) prepared in accordance with the present invention. Also in the present Example, an excimer laser (KrF, wave length 248 nm) was used as a crystallizing means.

FIGS. 1 to 5 show the preparing process diagrams of TFT (thin film insulated gate field effect transistor) obtained in accordance with the present Example. In the present Example, a glass or a quartz substrate was used as a substrate. This is due to the aim that the TFT prepared in the present Example will be used as a switching device or a driving device of an active matrix type liquid crystal display device or an image sensor. However, in case where the present invention is used in the other semiconductor device, as a substrate, a single crystal or a polycrystal of silicon may be used, and other insulating material may be used.

Figure 1:
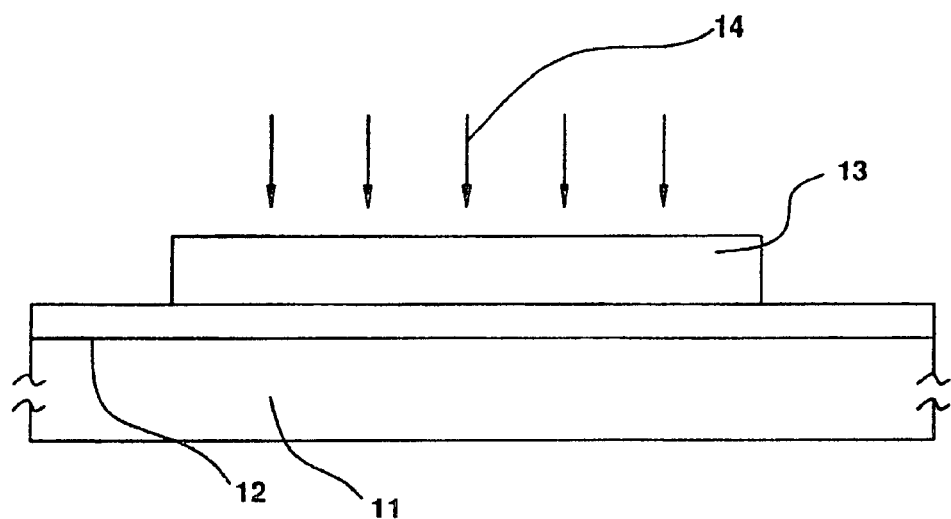
FIG. 1 shows a preparing process diagram of the insulating gate thin film type field effect transistor (hereinafter referred to as TFT) obtained according to Example 1.
Figure 2:
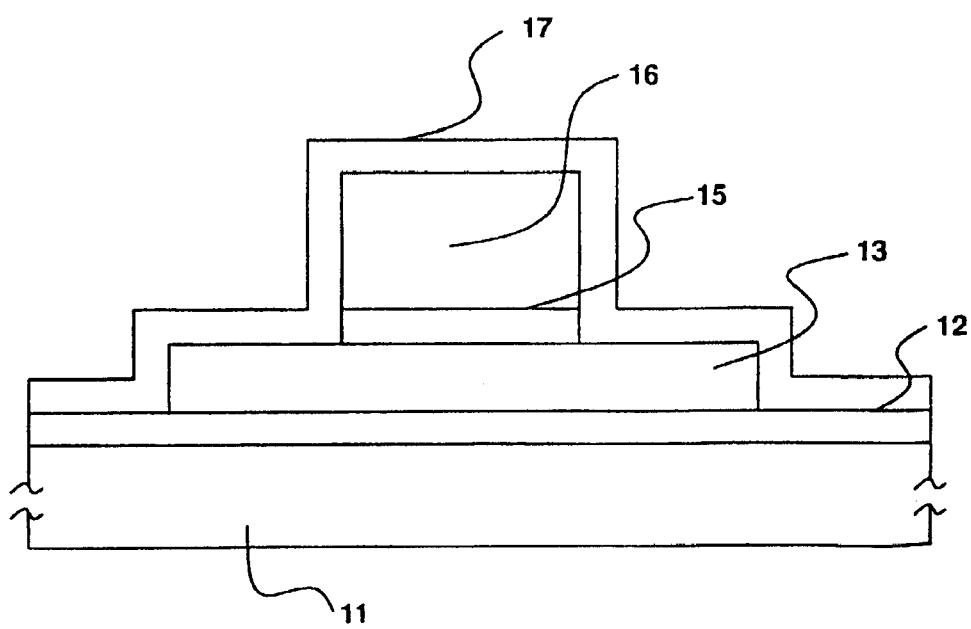
FIG. 2 shows an another preparing process diagram of TFT obtained according to Example 1.

In FIG. 1, $SiO_2$ film or silicon nitride film was formed on a glass substrate 11, as a base protective film 12. In the present Example, $SiO_2$ film 12 was formed in 200 nm thick, by RF sputtering in an atmosphere of 100% oxygen. The film forming condition was as follows: $O_2$ flow amount; 50 sccm, Pressure; 0.5 pa, RF electric power; 500 W, and Substrate temperature; 150° C.

Next, an intrinsic or a substantially intrinsic (which is meant by that an impurity is not added artificially) non-crystalline (amorphous or microcrystal)silicon hydride semiconductor layer 13 was formed in 100 nm thick, by a plasma CVD method. A channel forming region will be formed in this layer 13. The film forming condition was as follows: Atmosphere; 100% of silane ($SiH_4$), Film forming temperature; 160° C. (substrate temperature), Film forming pressure; 0.05 Torr, and Making power; 20 W (13.56 MHz). In the present Example, as a film forming material gas of a non-crystalline (amorphous or microcrystal) silicon, silane was used. But in case where a non-crystalline (amorphous or microcrystal) silicon is made be polycrystallized by a heat crystallization, disilane especially trisilane may be used in order to lower the crystallization temperature.

To conduct the film forming in an atmosphere of 100% silane was based on the experimental result that the non-crystalline (amorphous or microcrystal) silicon film formed in said atmosphere was more inclined to crystallize, compared with the one formed in such conventional atmosphere as the atmosphere of silane diluted with hydrogen. To effect the film forming at the low temperature was resulted from reason that a bonding hand of silicon would be neutralized as much as possible with hydrogen, by making a lot of hydrogen contain in the formed non-crystalline (amorphous or microcrystal) silicon film.

Also, the application of the low making power of a high frequency wave energy (13.56 MHz) such as 20 W was to prevent the film from being arisen of a silicon cluster i.e. a part having crystal, in the film forming process to the utmost. This was also based on the experimental result that if even a little of crystalline part was contained in the non-crystalline (amorphous or microcrystal) silicon film, it gave a bad influence on the crystallization in the later laser irradiation process (it gave an irregular crystallization).

Next, a device separation patterning was carried out to get a shape shown in FIG. 1. Then, a high density dangling bond was formed in the film, drawing hydrogen thoroughly from the film, by heating the sample at 450° C. for an hour in a vacuum ($10^{-6}$ Torr or less). Further, the crystallization of sample was effected, by an excimer laser irradiation, keeping a vacuum condition in the chamber in which the aforesaid hydrogen drawing out was conducted. The process condition using a KrF excimer laser (wave length 248 nm) was as follows: Laser irradiation energy density; 350 $mJ/cm^2$, Pulse No.; 1 to 10 shot, and Substrate temperature; 400° C. After the finishment of laser irradiation, the temperature was lowered to 100° C. in hydrogen reduced atmosphere (about 1 Torr).

Figure 6:
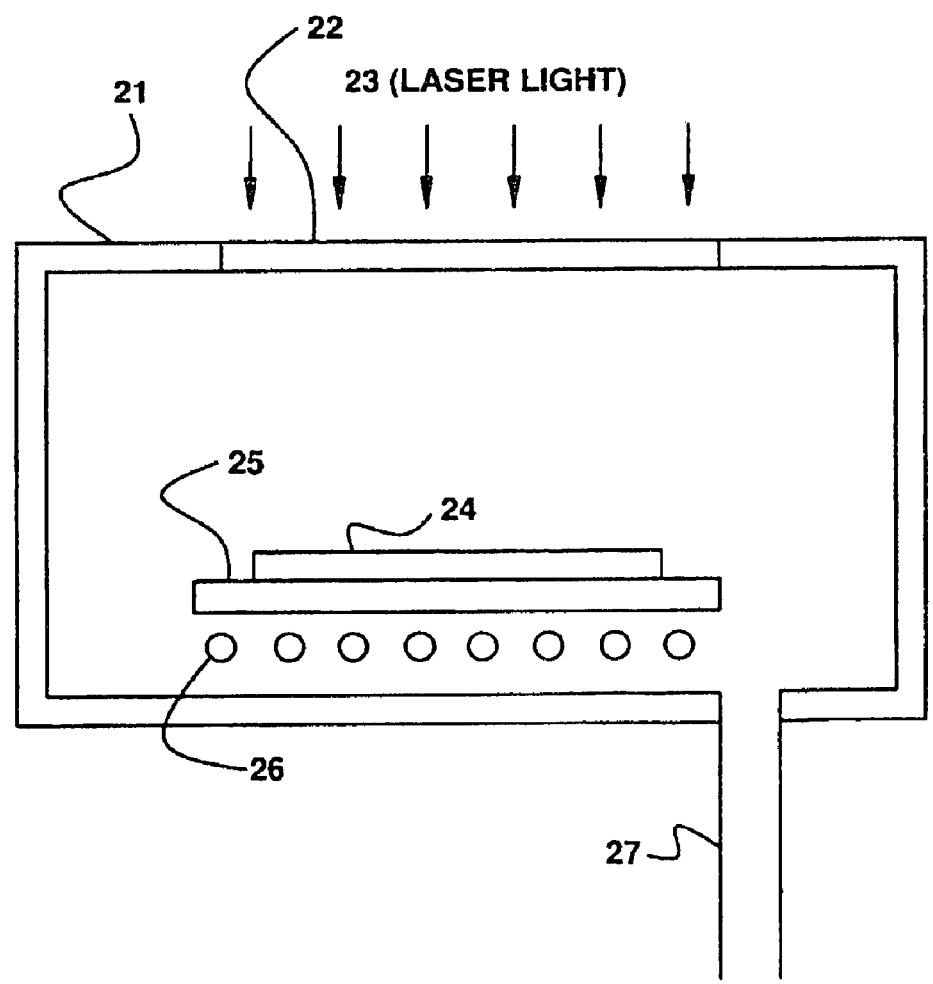
FIG. 6 shows a schematic diagram of the vacuum chamber used in Example 1.

In the present Example, the above heating process for hydrogen drawing out from the sample and the crystallization by an excimer laser irradiation was executed, using the same vacuum chamber as shown in FIG. 6. By using such vacuum chamber, it is possible to make it easy to maintain vacuum condition, covering from the heating process to the crystallizing process by a laser irradiation, and to obtain a film into which an impurity (especially oxygen) is not mixed. Of course, the processes from the film forming to the laser irradiation may be effected in succession, without a transfer of sample, by using such plasma CVD apparatus as is provided with a high vacuum exhausting device and have a window of quartz etc. so that a laser can be irradiated from the outside, instead of the chamber exclusively used in the laser annealing.

In FIG. 6, the numerals are as follows: 21; Vacuum chamber, 22; Quartz window for irradiation of laser from the outside of vacuum chamber 21, 23; Laser light when laser was irradiated, 24; Sample, 25; Sample holder, 26; Heater for sample heating, and 27; Exhausting system, in which a rotary pump for a low vacuum, and a turbo molecular pump for a high vacuum were used, and it was tried to reduce a remained concentration of an impurity (especially oxygen) in the chamber to the utmost.

After crystallization by an excimer laser, using the vacuum chamber of FIG. 6, $SiO_2$ film was formed in 50 nm thick by RF sputtering method, only gate region of which was patterned utilizing a photoresist to form an insulating film 15. This insulating film was so provided that a channel forming region thereof was protected not to be contaminated with an impurity (especially oxygen). Also, the photoresist 16 on the insulating film 15 made be remained without being removed, and a channel forming region was formed beneath this insulating film (gate insulating film) 15.

Then, an $n^+$-type non-crystal silicon film 17 to be a source and a drain region was formed in 50 nm thick, by a plasma CVD method under the condition described below:

Film forming atmosphere; $H_2:SiH_4=50:1$ (1% of $PH_3$ was added); Substrate temperature; 150 to 200° C., Film forming pressure; 0.1 Torr, and Making power; 100 to 200 W. As to the film forming, it is preferable to form a film holding the temperature at 200° C. or lower, so that the resist will not harden by heat. Also, here, P-channel type TFT can be obtained, by adding an impurity (e.g. $B_2H_6$ is used) which gives P-type conductivity. Under these situation, the shape of FIG. 2 was obtained. Then, an $n^+$ type non-crystalline (amorphous or microcrystal) silicon film was removed from on a gate region by a lift off method to obtain the shape of FIG. 3. This is a method to remove a film formed in the circumference and on this photoresist (in this case, $n_+$-type non-crystal silicon film) along with a photoresist, by removing the remained photoresist at the same time.

Figure 3:
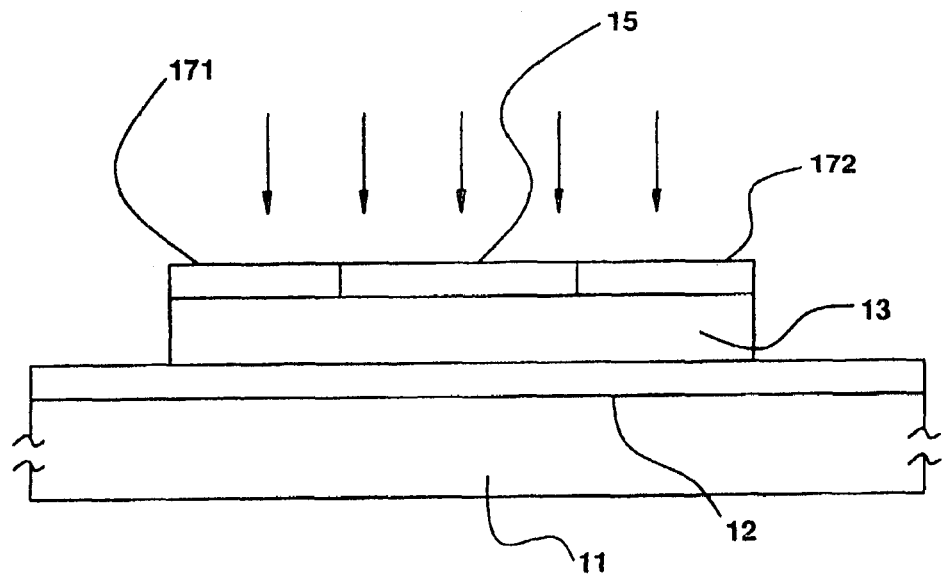
FIG. 3 shows a still another preparing process diagram of TFT obtained according to Example 1.

Further, as indicated by an arrow in FIG. 3, an energy was given to $n^+$-type non-crystalline (amorphous or microcrystal) silicon film to become a source and drain region (171 and 172), by irradiation of KrF excimer laser, and the source, drain region was activated (activation of an impurity which was contained in source, drain region and gives one conductivity type). At this time, the laser irradiation condition by KrF excimer laser (248 nm) was below:

Energy density; 250 $mJ/cm^2$, Pulse No.; 10 to 50 shots, and Substrate temperature; 350° C. Of course, here, it is needless to say that a laser except the KrF excimer laser can be used.

After the above process was over, the sheet resistance of $n^+$-type non-crystalline silicon film to become a source, drain region was lowered to the degree of 100 to 200 $\Omega$/cm. Also, silicon oxide film 15, the protective film which protected a channel forming region (region under 15) was removed.

Figure 4:
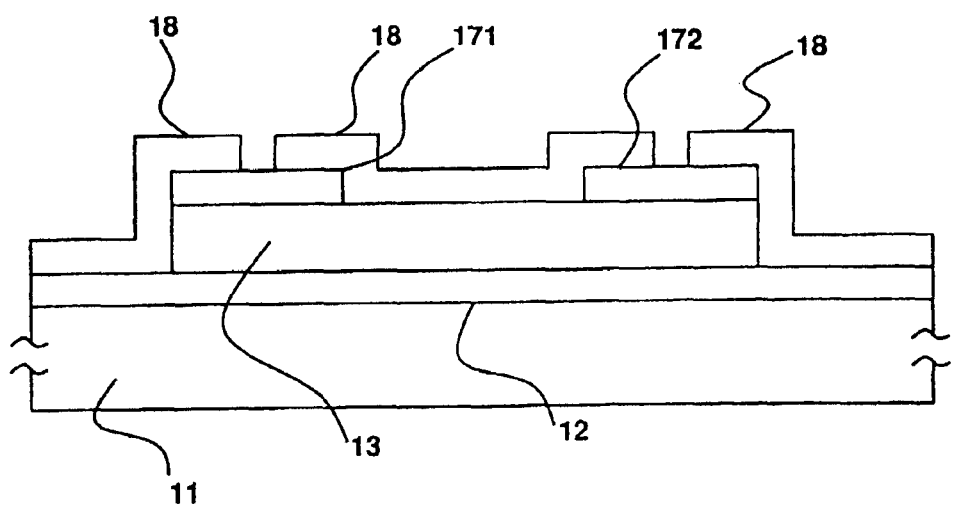
FIG. 4 shows a further preparing process diagram of TFT obtained according to Example 1.
Figure 5:
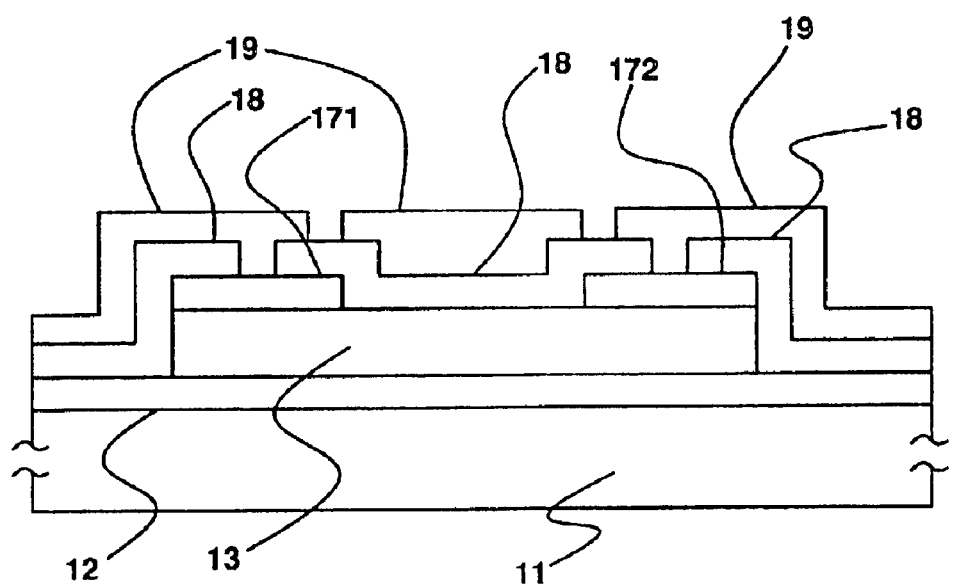
FIG. 5 shows a still further preparing process diagram of TFT obtained according to Example 1.

After the above activation of the source, drain region, $SiO_2$ film 18 was formed in 100 nm thick by RF sputtering method, as shown in FIG. 4. The film forming condition was the same with the preparation method of a gate oxide film.

Then, the openings for contacts were formed by patterning to obtain the shape of FIG. 4. Further, aluminum for an electrode was vapor deposited and the wirings and electrodes were formed by patterning. After that, hydrogen annealing was executed, in hydrogen atmosphere of 350° C. to finish a device.

Figure 7:
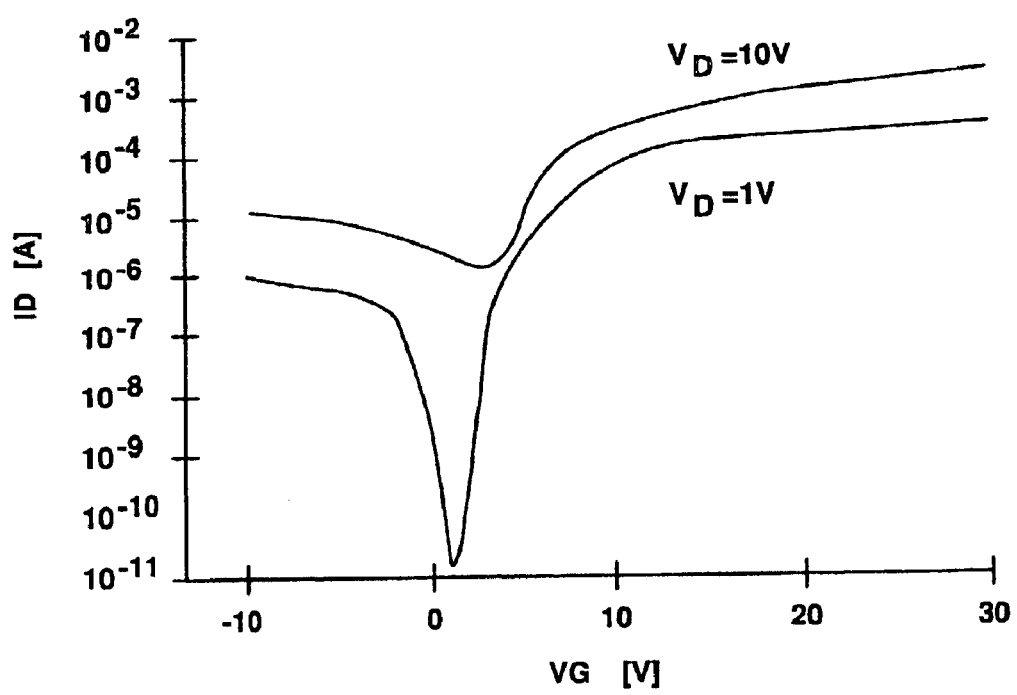
FIG. 7 is a graph showing the electric property of TFT obtained according to Example 1.

FIG. 7 is a graph showing a characteristic of $I_D$-$V_G$ of TFT prepared according to the present Example. In FIG. 7, $I_D$ is drain current, and VG is gate voltage. Also, the cases of 10 V and 1 V of drain voltage are shown.

The comparative data between the various characteristics of TFT prepared according to the present Example, and TFT obtained by the conventional preparing method are shown in the Table 1.

COMPARATIVE EXAMPLE

The different point between Example 1 and Comparative Example was that in Example 1, the vacuum condition was maintained, throughout the processes from the heating for hydrogen drawing out to the laser irradiation for crystallization. To the contrary, in the Comparative Example, the different chambers were used respectively with respect to the above processes of Example 1. Then, the sample surface, i.e. the surface of non-crystalline silicon semiconductor film was exposed to the open air, when the sample was moved from the heating furnace, in which the heating for hydrogen drawing out was effected, to the vacuum chamber to apply a laser irradiation. Other preparing process conditions were the same with Example 1. It can be therefore understood that by comparing this Comparative Example with Example 1, how it is important to maintain the vacuum atmosphere in the processes from hydrogen drawing out to the crystallization, in relation to the present invention in which high density dangling bond will be formed, by drawing out hydrogen.

The Table 1 shows the electrical properties of Example 1 and this Comparative Example. From the Table 1, it is evident that Example 1 is superior to Comparative Example, in all respects of Field Effect Mobility, ON/OFF Current Ratio, Threshold Value Voltage, and S Value.

TABLE 1

|  | Field Effect Mobility | ON/OFF Current Ratio | Threshold Value Voltage | S Value |
| --- | --- | --- | --- | --- |
| Example 1 | 329 cm$^2$/Vs | 7.6 × 10$^7$ | 3.7 V | 0.37 |
| Comparative Example | 61 cm$^2$/Vs | 7.8 × 10$^5$ | 4.8 V | 0.57 |

The Field Effect Mobility in the Table 1 is an index showing a speed that a carrier crosses a channel, and it indicates that the bigger this value is, the higher switching speed and operation frequency are.

ON/OFF Current Ratio is defined as a ratio of the ID value in case of $V_D$=1(V), $V_G$=30(V) and the minimum $I_D$ value of $I_D$-$V_G$ curve (shown in FIG. 7) in the same case. It indicates that the bigger this ON/OFF Current Ratio is, the less leak current in case of OFF time is, which shows an excellent switching device.

Threshold Value Voltage indicates that the lower this value is, the less current consumption is. In case of an active matrix type liquid crystal display device, which is required to drive hundred thousands of TFT, it is important problem that the Threshold Value Voltage is low.

S Value is a minimum value of $(d(I_D)/d(V_G))-1$ in the rising part of curve, in the graph showing a relationship of gate voltage ($V_G$) and drain current ($I_D$) as shown in FIG. 7, and it indicates a parameter representing a steepness of $I_D$-$V_G$ curve. It is appreciated that the less this S Value is, the more excellent device in a switching property is.

As mentioned in the above, it is understood that a high characteristic TFT can be prepared in accordance with the present invention. At the same time, it is also understood that a polycrystal silicon semiconductor which is excellent in an electrical quality can be obtained. In particular, it is apparent that the shifting from the heating process for drawing out of hydrogen to the crystallizing process keeping a vacuum condition is important, in contrast to the Comparative Example.

It is needless to say that TFT obtained by the present Example can be applicable to a switching device of a liquid crystal display device as well as an integrated circuit device. Also, the present invention is not limited to a structure of TFT obtained by the present Example, but is available to a preparing method of TFT which forms a source, drain region, by an ion implantation in a self-alignment method.

EXAMPLE 2

According to this Example, in the TFT prepared in Example 1, the crystallization was carried out by a heating. The heating temperature and the heating time for the crystallization were 600° C. and 48 hrs. respectively.

Also, according to this Example, the device separation patterning conducted in the Example 1 was executed after the crystallization by heating. Namely, after a non-crystalline (amorphous or microcrystal) silicon intrinsic or substantially intrinsic (it is meant by that an impurity is not made be mixed artificially) semiconductor film to become a channel region, in which there existed high-densely bonds between silicon and hydrogen, was formed, hydrogen was drawn out at the temperature of from 350° C. to 500° C. (at 450° C. or less in case of low oxygen content in a film), maintaining a vacuum condition without being exposed to the open air, and then, a crystallization was carried out, at the temperature of 600° C. maintaining the vacuum condition as it was in succession. After that, a device separation patterning was executed.

The heating process for the hydrogen drawing out was conducted at 400° C. for an hour, and the heating process for crystallization was conducted at 600° C. for 48 hrs. Other processes were conducted in accordance with the same processes as those in Example 1. Also in this Example, a lot of dangling bonds were formed, drawing out hydrogen from the non-crystalline (amorphous or microcrystal) silicon film, which was obtained by combination of an excess hydrogen with silicon, and then, it was important that the heating for a crystallization was effected, by keeping the non-crystalline (amorphous or microcrystal) silicon film, in which a lot of these dangling bonds existed, in a vacuum condition.

In the above explanation, it is mainly referred to silicon, but the present invention is useful for the cases where other non-crystalline (amorphous or microcrystal) semiconductor film is crystallized. Also, it is needless to say that the polycrystal semiconductor film prepared according to the present invention can be applied to a photoelectric conversion device or other semiconductor device.

In accordance with the present invention, by conducting the following process steps, a polycrystal silicon semiconductor film having an excellent electrical property can be obtained, and it has become apparent that TFT using this polycrystal silicon semiconductor film has a remarkable characteristics.

(a) preparing a non-crystalline (amorphous or microcrystal) silicon hydride film at low temperature, and producing a lot of Si—H bondings in said film, (b) applying a heat treatment in a vacuum to said non-crystalline (amorphous or microcrystal) silicon hydride film prepared in the (a) process, and dehydrogenating it to produce a lot of dangling bonds, and (c) applying an excimer laser irradiation in a vacuum as such in the (b) process, or applying a heat treatment for a crystallization.

What is claimed is:

1. A method for forming a semiconductor device comprising the steps of:

forming a semiconductor film over a substrate through a plasma CVD in an atmosphere consisting essentially of silane not diluted with at least hydrogen;

heating the semiconductor film to discharge hydrogen contained therein; and irradiating a laser light directly to the semiconductor film to crystallize the semiconductor film.

2. A method according to claim 1, wherein the semiconductor device is incorporated into an active matrix display device.

3. A method according to claim 1, wherein the semiconductor device is incorporated into an image sensor.

4. A method according to claim 1, wherein the substrate is selected from the group consisting of a glass substrate, a quartz substrate and a single crystalline silicon substrate.

5. A method for forming a semiconductor device comprising the steps of:

forming a semiconductor film over a substrate through a plasma CVD in an atmosphere consisting essentially of silane which is not diluted with a least hydrogen;

heating the semiconductor film to discharge hydrogen contained herein; and irradiating a laser light in an inactive gas atmosphere directly to the semiconductor film to crystallize the semiconductor film.

6. A method according to claim 5, wherein the semiconductor device is incorporated into an active matrix display device.

7. A method according to claim 5, wherein the semiconductor device is incorporated into an image sensor.

8. A method according to claim 5, wherein the substrate is selected from the group consisting of a glass substrate, a quartz substrate and a single crystalline silicon substrate.

9. A method for forming a semiconductor device comprising the steps of:

forming an insulating film over a substrate;

forming a semiconductor film over the insulating film through a plasma CVD in an atmosphere consisting essentially of silane which is not diluted with at least hydrogen;

heating the semiconductor film to discharge hydrogen contained therein; and irradiating a laser light directly to the semiconductor film to crystallize the semiconductor film.

10. A method according to claim 9, wherein the semiconductor device is incorporated into an active matrix display device.

11. A method according to claim 9, wherein the semiconductor device is incorporated into an image sensor.

12. A method according to claim 9, wherein the substrate is selected from the group consisting of a glass substrate, a quartz substrate and a single crystalline silicon substrate.

13. A method for forming a semiconductor device comprising the steps of:

forming a semiconductor film over a substrate through a plasma CVD in an atmosphere consisting essentially of silane which is not diluted with at least hydrogen;

heating the semiconductor film to discharge hydrogen contained therein;

patterning the semiconductor film to form a semiconductor layer; and irradiating a laser light directly to the semiconductor layer o crystallize the semiconductor layer.

14. A method according to claim 13, wherein semiconductor device is incorporated into an active matrix display device.

15. A method according to claim 13, wherein the semiconductor device is incorporated into an image sensor.

16. A method according to claim 13, wherein the substrate is selected from the group consisting of a glass substrate, a quartz substrate and a single crystalline silicon substrate.

17. A method for forming a semiconductor device comprising the steps of:

forming a semiconductor film over a substrate through a plasma CVD in an atmosphere consisting essentially of silane which is not diluted with a least hydrogen;

heating the semiconductor film to discharge hydrogen contained therein; and irradiating a laser light in vacuum directly to the semiconductor film to crystallize the semiconductor film.

18. A method according to claim 17, wherein the semiconductor device is incorporated into an active matrix display device.

19. A method according to claim 17, wherein the semiconductor device is incorporated into an image sensor.

20. A method according to claim 17, wherein the substrate is selected from the group consisting of a glass substrate, a quartz substrate and a single crystalline silicon substrate.

21. A method for forming a semiconductor device comprising the steps of:

forming a semiconductor film over a substrate through a plasma CVD in an atmosphere consisting essentially of silane which is not diluted with at least hydrogen;

heating the semiconductor film to discharge hydrogen contained therein; and irradiating a laser light directly to the semiconductor film the crystallize the semiconductor film, wherein the forming step and the irradiating step are performed continuously without breaking vacuum.

22. A method according to claim 21, wherein the semiconductor device is incorporated into an active matrix display device.

23. A method according to claim 21, wherein the semiconductor device is incorporated into an image sensor.

24. A method according to claim 21, wherein the substrate is selected from the group consisting of a glass substrate a quartz substrate and a single crystalline silicon substrate.

* * * * *